(12) United States Patent
Farnworth

(10) Patent No.: US 7,170,361 B1
(45) Date of Patent: Jan. 30, 2007

(54) METHOD AND APPARATUS OF INTERPOSING VOLTAGE REFERENCE TRACES BETWEEN SIGNAL TRACES IN SEMICONDUCTOR DEVICES

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/548,942

(22) Filed: Apr. 13, 2000

(51) Int. Cl.
H01P 3/08 (2006.01)

(52) U.S. Cl. .................. 333/1; 333/238; 333/247; 257/778; 257/780

(58) Field of Classification Search ............. 333/1, 333/238, 246, 247; 257/778, 780
See application file for complete search history.

(56) References Cited

U.S. PATENT DOCUMENTS

| | | | |
|---|---|---|---|
| 3,398,232 A * | 8/1968 | Hoffman | 333/1 X |
| 3,679,826 A | 7/1972 | Crowell | |
| 3,990,102 A | 11/1976 | Okuhara et al. | |
| 4,130,723 A * | 12/1978 | Wakeling | 333/238 X |
| 4,349,848 A | 9/1982 | Ishii et al. | |
| 4,626,889 A | 12/1986 | Yamamoto et al. | |
| 4,651,163 A | 3/1987 | Sutera et al. | |
| 4,680,557 A * | 7/1987 | Compton | 333/1 |
| 4,833,521 A | 5/1989 | Early | |
| 5,371,653 A | 12/1994 | Kametani et al. | |
| 5,451,917 A | 9/1995 | Yamamoto et al. | |
| 5,590,030 A | 12/1996 | Kametani et al. | |
| 5,631,446 A * | 5/1997 | Quan | 174/254 |
| 5,675,298 A | 10/1997 | Bhagwan et al. | |
| 5,785,789 A | 7/1998 | Gagnon et al. | |
| 5,796,321 A * | 8/1998 | Caillat et al. | 333/246 |
| 5,917,860 A | 6/1999 | Lee | |
| 5,945,886 A * | 8/1999 | Millar | 333/1 |
| 5,952,709 A | 9/1999 | Kitazawa et al. | |
| 6,040,524 A * | 3/2000 | Kobayashi et al. | 333/1 X |
| 6,175,287 B1 * | 1/2001 | Lampen et al. | 333/247 |
| 6,181,278 B1 * | 1/2001 | Kakimoto et al. | 343/700 MS |
| 6,262,660 B1 * | 7/2001 | Segale et al. | 257/728 |
| 6,373,740 B1 * | 4/2002 | Forbes et al. | 333/238 X |

FOREIGN PATENT DOCUMENTS

DE 239899 * 10/1986 ................. 333/238

* cited by examiner

*Primary Examiner*—Benny Lee
(74) *Attorney, Agent, or Firm*—TraskBritt

(57) ABSTRACT

A method and apparatus for substantially reducing or eliminating electromagnetic and electrostatic coupling between signal traces on a substrate is disclosed. A substrate, such as a printed circuit board, is formed with an electrically insulative layer and a conductive layer. A portion of the conductive layer is removed to form circuit traces including signal traces and voltage reference traces configured such that each signal trace is separated from each other signal trace by at least one voltage reference trace. The invention is also applied to multiple layer printed circuit boards including a single voltage reference plane, an electronic system, and a semiconductor substrate. According to another aspect of the invention, a majority of a conductive layer is left on an insulative layer of a substrate by removing only those portions of the conductive layer immediately adjacent signal traces such that the remaining conductive material, which is ordinarily removed, acts to couple electromagnetic and electrostatic fields from the signal traces.

3 Claims, 4 Drawing Sheets

METHOD AND APPARATUS OF INTERPOSING VOLTAGE REFERENCE TRACES BETWEEN SIGNAL TRACES IN SEMICONDUCTOR DEVICES

BACKGROUND OF THE INVENTION

1. Field of the Invention

The present invention relates generally to the reduction or elimination of "cross-talk" between semiconductor device signal traces by interposing a grounding element between the signal traces. More particularly, the present invention relates to interposing a grounding element between printed circuit board traces and vias to minimize or eliminate mutual coupling between signal conductors.

2. State of the Art

Cross-talk between two adjacent conductive signal traces is a result of electrostatic and electromagnetic coupling between the conductive traces. Electrostatic and electromagnetic coupling is related to the impedance of a signal trace such that as mutual coupling increases, impedance increases. Cross-talk between signal traces is undesirable because it may cause signal delays and interference with signals transmitted through the signal traces. The primary factors affecting cross-talk include the surface area of the signal trace directed to an adjacent signal trace, the distance between the signal traces and the dielectric constant ($\in_r$) of the material between the signal traces. Air has a dielectric constant of 1, while printed circuit board resin conventionally has a dielectric constant of between 3 and 4. In general, coupling and cross-talk between two adjacent conductive signal traces increases as the facing surface areas of the traces increase, as the dielectric constant of the material between the signal traces increases, and as the distance between the signal traces decreases.

With the continuous desire of manufacturing smaller semiconductor devices, the distances between signal traces have necessarily been reduced, and multiple-layer and specially fabricated semiconductor and printed circuit board materials have been used to compensate for the electromagnetic coupling caused by closer conductors. One approach to canceling the electromagnetic coupling of a bias source in an electronic device is disclosed in U.S. Pat. No. 4,349,848 to Ishii et al. (issued Sep. 14, 1982). Ishii et al. uses impedance cancellation methods to cancel mutual coupling between signal traces by placing bias currents having opposite phases in two separate signal traces running parallel to each other. In this way, the however, is not conducive to all signal traces, and is particularly not conducive to signal traces which do not run in parallel or do not carry complementary signals.

Another approach known in the art for reducing electromagnetic coupling between signal traces is to alternatively design printed circuit board or semiconductor materials which inherently reduce coupling. U.S. Pat. No. 5,785,789 to Gagnon et al. (issued Jul. 28, 1998) discloses multilayer circuit board structures comprising discrete, partially-cured, microsphere-filled resin layers. By specially fabricating circuit board layers, the dielectric constant of the printed circuit board is lowered, resulting in lower conductivity and coupling through the circuit board material. U.S. Pat. No. 3,990,102 to Okuhara et al. discloses a semiconductor integrated circuit comprising a dielectric isolation region and both a high resistivity layer and a low resistivity layer adjacent to monocrystalline regions to shield electrostatic coupling between circuit elements and prevent cross-talk. Specially designed and fabricated semiconductor and printed circuit board materials are conventionally, however, more expensive than standard materials.

Isolation of regions or signal traces using grounding and capacitive planes have also been used to reduce electromagnetic coupling. One approach to reducing cross-talk, as illustrated in FIG. 1, is to use a ground plane 2 on a substrate 4 to couple cross-talk 6 from a signal trace 8 to ground. Through the use of a ground plane 2, the signal traces 8 may be placed closer together than without the ground plane 2. A similar approach, shown in FIG. 2, is to use a ground plane 2 and a relatively thinner substrate 10. By using a thinner substrate 10, the signal traces 8 are placed closer to the ground plane 2 and, as a result, may then be placed closer to each other. Thus, everything else being equal, placing the ground plane 2 closer to the signal traces 8 decreases coupling and impedance, and allows for closer spacing of signal traces 8, as shown in FIG. 2.

U.S. Pat. No. 5,451,917 to Yamamoto et al. (issued Sep. 19, 1995) discloses a high frequency circuit shielded from external interference through a series of grounding and capacitive layers surrounding dielectric circuit layers. U.S. Pat. No. 5,371,653 to Kametani et al. (issued Dec. 6, 1994) discloses a multilayer circuit board comprising grounding layers above and below each layer of signal traces, each grounding layer being separated from the signal traces by insulative layers and further being thermally coupled to conductive grounding pins to release heat from the internal layers of the structure. U.S. Pat. No. 4,626,889 to Yamamoto et al. (issued Dec. 2, 1986) discloses several configurations of signal trace conductors and conductor layers in a printed circuit board, the printed circuit board also having grounded layers above and below the configurations of signal trace conductors, separated from the signal trace conductors by insulative layers. U.S. Pat. No. 5,945,886 to Millar (issued Aug. 31, 1999) also discloses a multilayer printed circuit board structure having a signal bus comprising straight signal traces of equal electrical length extending on a first layer of a printed circuit board and returning on a second layer of the printed circuit board. The first and second signal trace layers of the printed circuit board each have a distinct, adjacent ground plane. Coupled to each of the ground planes, Millar discloses additional straight signal traces parallel to, and of length equal to, the other signal traces. The additional signal traces are placed within a signal layer of the circuit board, in between the other parallel signal traces. The outer layers of the multilayer structures disclosed by Millar include circuit traces. Similar to specially designed substrate layers, however, the more layers which are included on a substrate, the more expensive the substrate is to fabricate.

Therefore, it is desirable to have a substrate design which reduces or eliminates cross-talk in a variety of signal trace configurations, yet does not require expensive specialty substrate layers and designs, or extensive multiple layer systems used in the prior art.

SUMMARY OF THE INVENTION

The present invention provides a relatively inexpensive alternative to complex and specially fabricated substrates by placing voltage reference traces between each of two signal traces to couple any electrostatic or electromagnetic "cross-talk" which would have occurred between the signal traces. By placing voltage reference traces between adjacent signal traces, cross-talk is effectively reduced without the expense and complexity of structures previously known in the art. According to a first aspect of the invention, each of a plurality of signal traces placed on a first surface of an electrically insulative substrate is separated from the remaining signal traces by at least one voltage reference trace. This aspect of the invention may be further enhanced by placing a voltage reference plane on a second surface of the electrically insulative substrate and optionally coupling each of the voltage reference traces to the voltage reference plane. The invention may also be applied to multiple layer circuit boards, optionally connecting portions of the various layers through vias. Signal trace vias may also be separated by voltage reference trace vias.

According to a second aspect of the invention, on an electrically conductive layer formed on an electrically insulative substrate, a portion of the electrically conductive material is removed to form conductive coplanar circuit traces separated from the remainder of the electrically conductive layer by a narrow trough or gap. The remainder of the substantially coplanar electrically conductive layer, excluding the circuit traces, may then be coupled to a reference voltage to couple electrostatic and electromagnetic fields from the circuit traces.

An electronic system is disclosed comprising a processor, a memory device, an input, an output and a storage device, at least one of which includes a printed circuit board or other substrate having two or more signal traces configured such that the two signal traces are separated by at least one voltage reference trace.

BRIEF DESCRIPTION OF THE DRAWINGS

The nature of the present invention as well as other embodiments of the present invention may be more clearly understood by reference to the following detailed description of the invention, to the appended claims, and to several drawings herein, wherein:

DETAILED DESCRIPTION OF THE INVENTION

Figure 3:
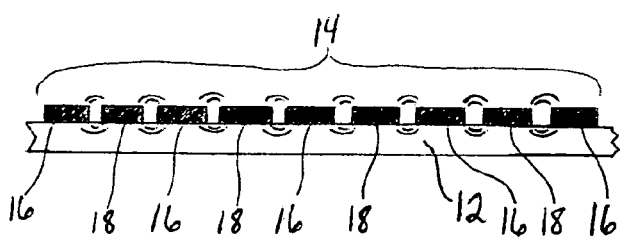
FIG. 3 is a diagram illustrating signal traces and voltage reference traces atop an insulating substrate according to an embodiment of the present invention.

FIG. 3 is a diagram illustrating a substrate 12, such as a printed circuit board ("PCB") or a semiconductor die, having circuit traces 14 thereon. The circuit traces 14 are formed using methods such as masking and etching, masking and deposition in mask apertures, trace stamping, doping a substrate, or other methods well known in the art. As used herein, the term "circuit trace" refers not only to a surface conductive path which is conventionally formed upon the surface of a printed circuit board, but to any conductive path formed on, in or through a substrate such as a printed circuit board, thin film device or other semiconductor device. The circuit traces 14 of the present invention are primarily of two kinds, signal traces 16 and voltage reference traces 18. According to an embodiment of the invention shown in FIG. 3, each signal trace 16 is separated from each adjacent signal trace 16 by at least one voltage reference trace 18. Thus, when signals are transmitted through any of the signal traces 16, cross-talk which would have occurred between adjacent signal traces 16 is coupled by a voltage reference trace 18. By placing at least one voltage reference trace 18 between two signal traces 16, cross-talk between signal traces 16 is effectively reduced without specially designed substrate materials or complex multiple layer substrates. Additionally, because conventional substrate fabrication methods already include a step, such as the aforementioned masking and etching, to form circuit traces 14, the present invention does not require any additional fabrication steps. Furthermore, for methods involving etching fluid, where a portion of a conductive layer is dissolved to form circuit traces, because more of the conductive layer is left on the substrate when forming the circuit traces of the present embodiment than is conventionally removed, less etching fluid is required, thereby reducing the cost of fabrication.

Electromagnetic coupling between circuit traces occurs primarily between adjacent circuit traces. In reference to FIG. 4, the magnitude of the electromagnetic fields coupled, and the resulting current induced in an adjacent circuit trace 14, with a trace width ("W"), depend upon the space ("D") between the circuit traces 14, the material between the circuit traces 14, and the height ("H") between the upper surface of a substrate 12 and the upper surface of the circuit trace 14, and therefore the laterally facing surface areas, of the circuit traces 14. By placing a voltage reference trace 18 (FIG. 3) between two signal traces 16, electromagnetic and electrostatic fields are coupled by the voltage reference trace 18 rather than a signal trace 16. Circuit trace fabrication technology presently allows for a minimum space of 40 μm between copper circuit traces having a height of 18 μm. The limitation on the spacing between circuit traces is related to the isotropic etching process most preferably used to form the circuit traces. Because the traces are isotropically etched, the gap between the trace is at least two times the trace thickness. This ratio, however, will certainly improve as technology improves, and will be different for other technologies used.

Figure 5:
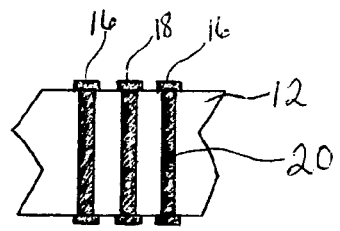
FIG. 5 is a diagram illustrating signal traces and a voltage reference trace extending through a substrate via according to an embodiment of the present invention.

The principles of the present invention are not limited to surface circuit traces. Cross-talk between conductive traces occurs any time a current-carrying conductive trace is placed near another conductive trace. FIG. 5 shows a portion of a substrate 12, such as a printed circuit board, including two signal traces 16 separated by a voltage reference trace 18, wherein the three traces 16 and 18 extend through the substrate by vias 20. It is also contemplated that circuit traces may be extended to one or more of various layers of a substrate using vias configured according to the present invention rather than extending completely through the substrate 12 as shown in FIG. 5.

Figure 6:
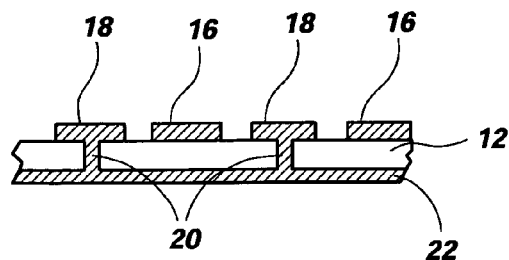
FIG. 6 is a diagram of voltage reference traces placed between signal traces on the surface of a printed circuit board having a voltage reference plane according to an embodiment of the present invention.
Figure 7:
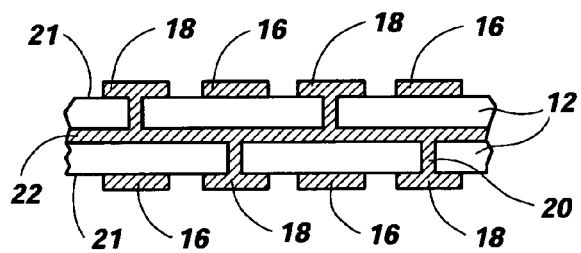
FIG. 7 is a diagram illustrating a multilayer substrate having signal traces and voltage reference traces atop an insulating substrate and voltage reference layer according to an embodiment of the present invention.

A conductive trace may begin to exhibit properties similar to that of an antenna when extended for a distance without coupling to a reference voltage. Thus, it is preferable that the voltage reference traces placed between the signal traces are periodically coupled to a reference voltage. The voltage reference traces should at least be coupled to a reference voltage at the beginning and end of the trace. More preferably, however, the voltage reference traces are coupled to a reference voltage at predetermined intervals to maintain a substantially consistent reference voltage throughout the extent of the trace. FIG. 6 illustrates a substrate 12 having voltage reference traces 18 and signal traces 16 on the surface thereof, each of the voltage reference traces 18 being coupled to a ground or reference voltage plane 22 on another surface of the substrate 12 through vias 20. By periodically coupling voltage reference traces 18 to a reference voltage plane 22 along the extents of the voltage reference traces 18, a more consistent reference voltage is maintained to more effectively reduce cross-talk between the signal traces 16. As shown in FIG. 7, the principles of this invention also work with multilayer substrates 12 having a reference voltage plane 22 placed between two electrically insulative substrate layers 12, with signal traces 16 disposed on each outer surface 21. The voltage reference traces 18 from each outer surface 21 of the overall substrate may be coupled to the voltage reference plane 22 through vias 20.

Figure 8:
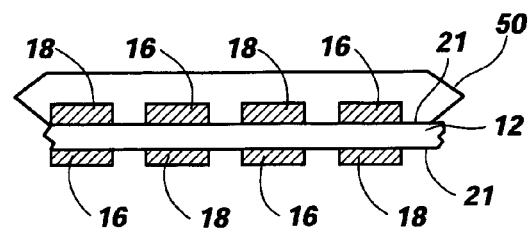
FIG. 8 is a diagram of a printed circuit board having circuit traces on two surfaces thereof according to an embodiment of the present invention.
Figure 10:
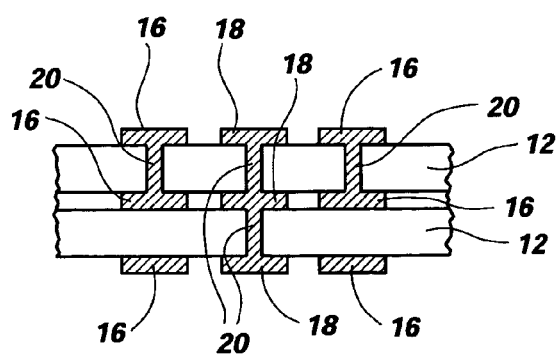
FIG. 10 is a diagram illustrating a multilayer substrate having multiple circuit traces configured according to another embodiment of the present invention.
Figure 9:
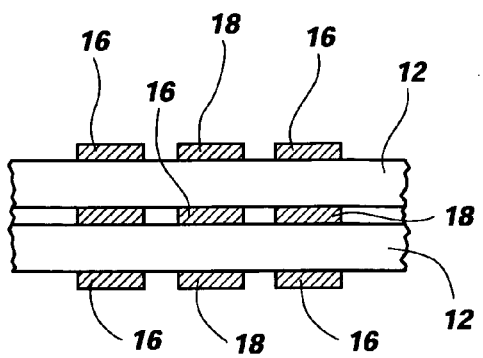
FIG. 9 is a diagram illustrating a multilayer substrate having multiple circuit traces configured according to an embodiment of the present invention.

As shown in FIG. 8, for substrate 12 having traces 16 and 18 on more than one surface of the substrate, a voltage reference trace 18 may be placed between two adjacent signal traces 16 for signal traces 16 on both surfaces of the substrate 12. For the embodiment shown in FIG. 8, the signal traces 16 on a first surface 21 of the substrate 12, in addition to being adjacent to a voltage reference trace 18 on the first surface 21 of the substrate 12, are adjacent a voltage reference trace 18 on the second surface 21 of the substrate 12. By configuring the traces 16 and 18 so that no signal trace 16 is directly adjacent any other signal trace 16, cross-talk is most substantially reduced. The embodiment of FIG. 8, wherein multiple layers of signal traces 16 are placed such that they are not adjacent to any other signal traces 16, may also be implemented in substrates having one or more signal traces on a layer within the substrate 12. FIG. 9 illustrates an embodiment of the present invention wherein voltage reference traces 18 are placed between two signal traces 16 such that no signal trace 16, whether on a common or different substrate layer 12 of the overall substrate, is placed immediately adjacent another signal trace 16. FIG. 10 illustrates an embodiment of the present invention wherein voltage reference traces 18 placed on or between different substrate layers 12 may be connected through vias 20. Signal traces 16 may also be coupled by vias 20 through a substrate layer 12.

Figure 11:
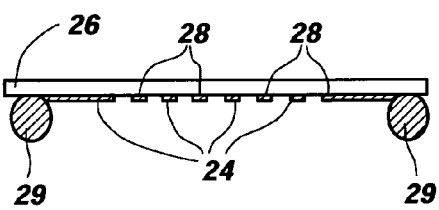
FIG. 11 is a diagram illustrating a flip-chip semiconductor die having circuit traces thereon configured according to an embodiment of the present invention.

FIG. 11 illustrates an embodiment of the present invention wherein circuit traces 24 are placed on the surface of a semiconductor substrate 26, more particularly, in a flip-chip ball grid array ("BGA") application. Like previous embodiments, the circuit traces 24 are configured such that a voltage reference trace 28 is placed between each of two signal traces 24 so that no signal trace 24 is placed immediately adjacent another signal trace 24. At least one of the solder balls 29 is operably coupled to at least one signal trace 24 and at least one solder ball 29 is operably coupled to a voltage reference trace 28.

Figure 12:
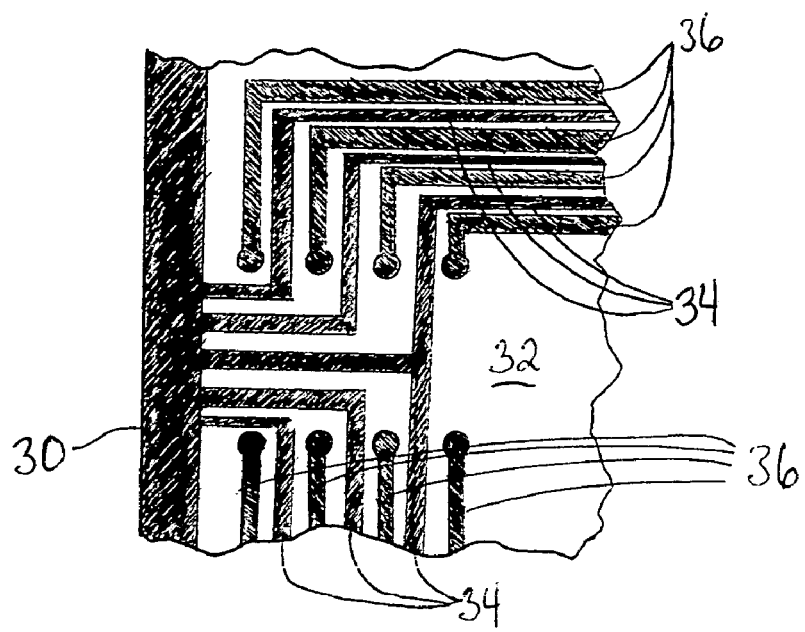
FIG. 12 is a top view of a substrate having circuit traces and a voltage reference bar thereon according to an embodiment of the present invention.

As illustrated by FIG. 12, for embodiments of the invention where no voltage reference plane is used, or in addition to a voltage reference plane, one or more voltage reference terminals, bars or buses 30 may be placed upon the substrate 32 at a point or points from or to which the voltage reference traces 34 may extend. As with previous embodiments, the voltage reference traces 34 of the present embodiment are placed between each of two adjacent signal traces 36 such that no two signal traces 36 are immediately adjacent each other. Additionally, the voltage reference traces 34 may be coupled to additional voltage reference terminals, bars or buses 30 at various points along their extents to reduce the extent to which the voltage reference traces 34 act as antennas. This configuration of circuit traces may also be placed between substrate layers as may be required for a particular application.

Figure 13:
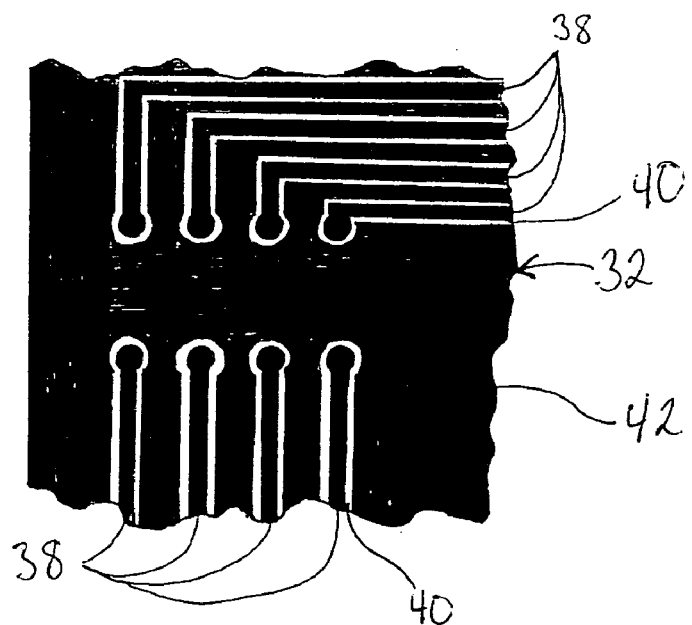
FIG. 13 is a top view of a substrate having conductive regions around the circuit traces removed according to an embodiment of the present invention.

Rather than forming distinct voltage reference traces on a substrate, conductive material from a conductive layer of the substrate may be removed only from portions immediately surrounding a desired signal trace location to create an electrically isolating trough or gap 40 (see FIG. 13) between the signal trace 38 and the remainder of the conductive material 42 on the substrate 32. As shown in FIG. 13, a layer of conductive material 42 on a substrate 32 has been removed only around the coplanar signal traces 38. Methods of removing selected portions of conductive material from a substrate, such as by masking and etching, are well known in the art. By leaving a majority of the conductive material 42 on the substrate 32, etching solution is preserved. Furthermore, by connecting the remaining conductive material 42, other than the coplanar signal traces 38, to a reference voltage, the electromagnetic or electrostatic field emanating from a signal trace 38 will not be coupled by an adjacent signal trace 38, but will be coupled by the conductive material 42 remaining between each of the signal traces 38. This aspect of the invention may also be applied to substrates having multiple conductive layers such as those described with regard to FIGS. 6–10. As will be clear to one of ordinary skill in the art, a region around the solder pads of a printed circuit board, or any other point where the signal traces connect with an external component, should be clear of conductive material for a region sufficient to avoid solder flow shorting the signal trace to the conductive material. The size of the cleared region required will depend upon the particular signal trace layout, bond pad size and soldering techniques used, but may be readily determined by one of ordinary skill in the art. As will also be clear to one of skill in the art, a passivation layer 50 (see FIGS. 8, 12 and 13) may be placed over a conductive layer to reduce the likelihood of shorts between the conductive traces due to dust or other debris. Passivation layers and methods of applying them are well known in the art.

Figure 14:
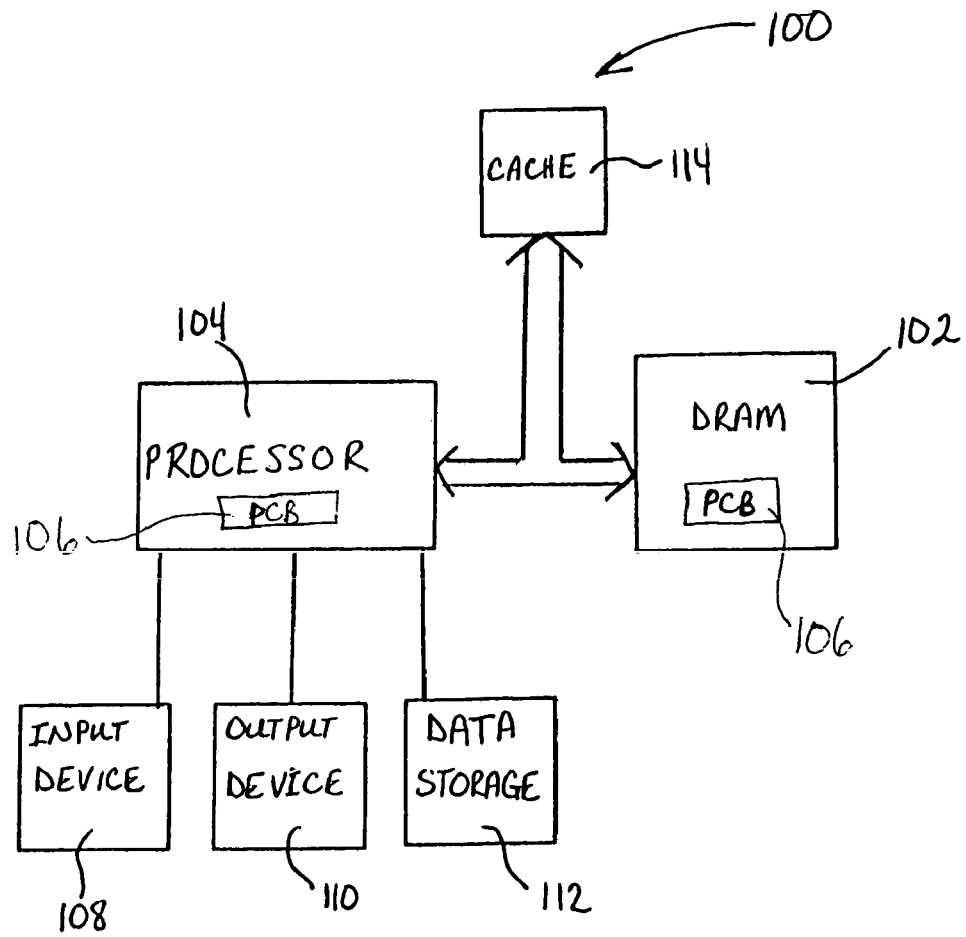
FIG. 14 is a block diagram of an electronic system including a printed circuit board according to the present invention.

FIG. 14 is a block diagram of an electronic system 100 which includes components having one or more printed circuit boards ("PCB") 106 or other substrates comprising circuit traces configured according to one or more embodiments of the present invention. The electronic system 100 includes a processor 104 for performing various computing functions, such as executing specific software to perform specific calculations or tasks. Additionally, the electronic system 100 includes one or more input devices 108, such as a keyboard or a mouse, coupled to the processor 104 to allow an operator to interface with the electronic system 100. The electronic system 100 also includes one or more output devices 110 coupled to the processor 104, such output devices including such outputs as a printer, a video terminal or a network connection. One or more data storage devices 112 are also conventionally coupled to the processor 104 to store or retrieve data from external storage media (not shown). Examples of conventional storage devices 112 include hard and floppy disks, tape cassettes, and compact disks. The processor 104 is also conventionally coupled to a cache memory 114, which is usually static random access memory ("SRAM"), and to DRAM 102. It will be understood, however, that the PCB 106 or other substrate configured according to one or more of the embodiments of the present invention may be incorporated into any one of the respective cache, DRAM, input, output, storage and processor devices 114, 102, 108, 110, 112, and 104.

Figure 15:
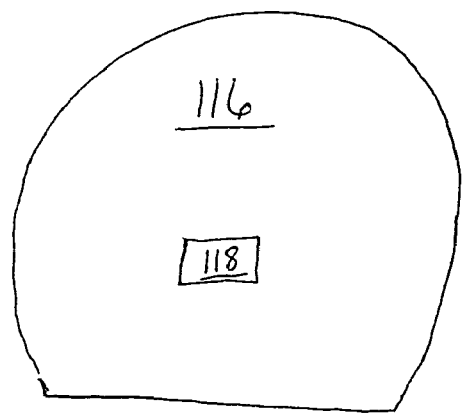
FIG. 15 is a diagram of a semiconductor wafer having circuit traces configured according to an embodiment of the present invention.

As shown in FIG. 15, circuit traces 118 may be fabricated on the surface of a semiconductor wafer 116 of silicon, gallium arsenide, or indium phosphide in accordance with one or more embodiments of the present invention. One of ordinary skill in the art will understand how to adapt such designs for a specific chip architecture or semiconductor fabrication process. Of course, it should be understood that the circuit traces 118 may be fabricated on semiconductor substrates other than a wafer, such as a Silicon-on-Insulator (SOI) substrate, a Silicon-on-Glass (SOG) substrate, a Silicon-on-Sapphire (SOS) substrate, or other semiconductor material layers on supporting substrates.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

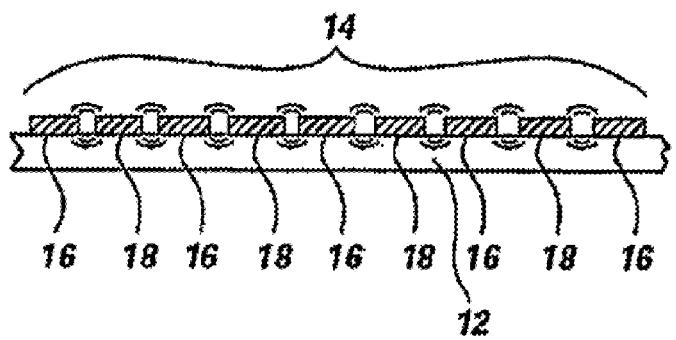

What is claimed is:

1. An electronic system, comprising:
    a processor;
    a memory device;
    at least one input device;
    at least one output device; and
    at least one data storage device;
    wherein at least one of the processor, the memory device, the at least one input device, the at least one output device and the at least one data storage device includes an electronic device comprising:
        a semiconductor substrate; and
        an electrically conductive layer disposed on at least one side of the semiconductor substrate, comprising;
            a voltage reference plane substantially covering the at least one side of the semiconductor substrate and configured for operable coupling to a voltage reference signal;
            a plurality of signal trace slots disposed in the voltage reference plane; and
            a plurality of signal traces disposed in the plurality of signal trace slots;
            wherein the plurality of signal traces are electrically isolated from the voltage reference plane by a gap in the electrically conductive layer with a gap distance sufficient to avoid an electrical short between the plurality of signal traces and the voltage reference plane; and
            wherein the voltage reference plane provides a continuous electrical connection around each of the plurality of signal trace slots such that at least a portion of the voltage reference plane is disposed between any two of the plurality of signal traces to reduce cross talk between signals carried by the any two of the plurality of signal traces; and
        a plurality of solder balls disposed on the at least one side of the semiconductor substrate, wherein at least one of the plurality of solder balls is operably coupled to at least one of the plurality of signal traces and at least one of the plurality of solder balls is operably coupled to the voltage reference signal;
        wherein at least one of the plurality of signal traces includes at least one direction change in the length thereof over the semiconductor substrate.

2. An electronic device, comprising:
    a semiconductor substrate;
    an electrically conductive layer disposed on at least one side of the semiconductor substrate, comprising;
        a voltage reference plane substantially covering the at least one side of the semiconductor substrate and configured for operable coupling to a voltage reference signal;
        a plurality of signal trace slots disposed in the voltage reference plane; and
        a plurality of signal traces disposed in the plurality of signal trace slots;
        wherein the plurality of signal traces are electrically isolated from the voltage reference plane by a gap in the electrically conductive layer with a gap distance sufficient to avoid an electrical short between the plurality of signal traces and the voltage reference plane; and
        wherein the voltage reference plane provides a continuous electrical connection around each of the plurality of signal trace slots such that at least a portion of the voltage reference plane is disposed between any two of the plurality of signal traces to reduce cross talk between signals carried by the any two of the plurality of signal traces; and
    a plurality of solder balls disposed on the at least one side of the semiconductor substrate, wherein at least one of the plurality of solder balls is operably coupled to at least one of the plurality of signal traces and at least one of the plurality of solder balls is operably coupled to the voltage reference signal;
    wherein at least one of the plurality of signal traces includes at least one direction change in the length thereof over the semiconductor substrate.

3. The electronic device of claim 2, further comprising a passivation layer disposed on the electrically conductive layer.

* * * * *

UNITED STATES PATENT AND TRADEMARK OFFICE
CERTIFICATE OF CORRECTION

| | |
|---|---|
| PATENT NO. | : 7,170,361 B1 |
| APPLICATION NO. | : 09/548942 |
| DATED | : January 30, 2007 |
| INVENTOR(S) | : Farnworth |

It is certified that error appears in the above-identified patent and that said Letters Patent is hereby corrected as shown below:

Delete Title page illustrating a figure(s), and substitute therefor, new Title page illustrating a figure(s). (attached)

In item (56), "References Cited,"
U.S. PATENT DOCUMENTS,
$2^{nd}$ column, $10^{th}$ entry:   Delete "6,262,660 B1 * 7/2001 Segale et al. ...257/728"
and insert in its place:
--6,232,660 B1 * 5/2001 Kakimoto et al. .......257/728--

Figure 1:
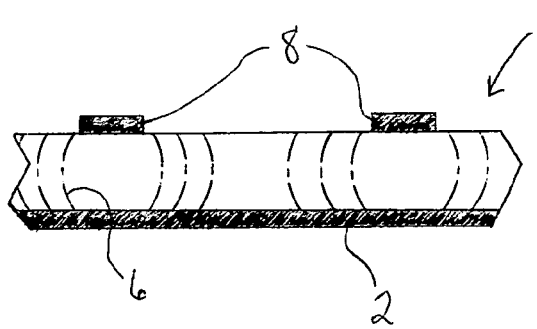
FIG. 1 is a diagram of a prior art substrate having signal traces spaced from a grounding layer by a thick insulating layer.

In the drawings:
In FIG. 1,    replace the informal drawing of FIG. 1 with the formal drawing of FIG. 1
In FIG. 2,    replace the informal drawing of FIG. 2 with the formal drawing of FIG. 2
In FIG. 3,    replace the informal drawing of FIG. 3 with the formal drawing of FIG. 3
In FIG. 4,    replace the informal drawing of FIG. 4 with the formal drawing of FIG. 4
In FIG. 5,    replace the informal drawing of FIG. 5 with the formal drawing of FIG 5
In FIG. 11,   replace the drawing of FIG. 11 with FIG. 11 amended on April 4, 2006, by inserting reference numerals --28-- and --29-- (two occurrences each)
In FIG. 12,   replace the informal drawing of FIG. 12 with the formal drawing of FIG. 12
In FIG. 13,   replace the informal drawing of FIG. 13 with the formal drawing of FIG.13
In FIG. 14,   replace the informal drawing of FIG. 14 with the formal drawing of FIG.14
In FIG. 15,   replace the informal drawing of FIG. 15 with the formal drawing of FIG.15

UNITED STATES PATENT AND TRADEMARK OFFICE
CERTIFICATE OF CORRECTION

| | | |
|---|---|---|
| PATENT NO. | : 7,170,361 B1 | Page 2 of 7 |
| APPLICATION NO. | : 09/548942 | |
| DATED | : January 30, 2007 | |
| INVENTOR(S) | : Farnworth | |

It is certified that error appears in the above-identified patent and that said Letters Patent is hereby corrected as shown below:

In the drawings (cont'd):
Please replace FIG. 1 with the following replacement figure:

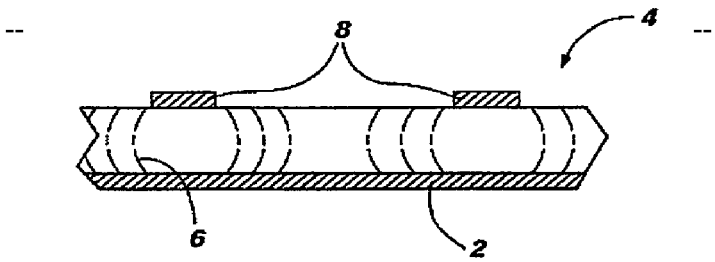

Fig. 1
(PRIOR ART)

Figure 2:
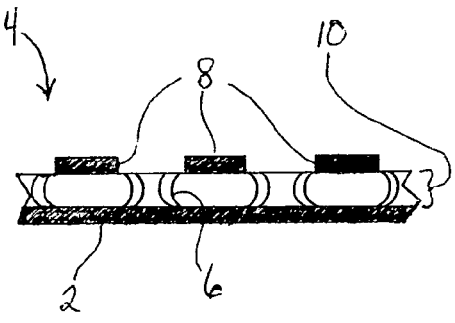
FIG. 2 is a diagram of a prior art substrate having signal traces spaced from a grounding layer by a thin insulating layer.

Please replace FIG. 2 with the following replacement figure:

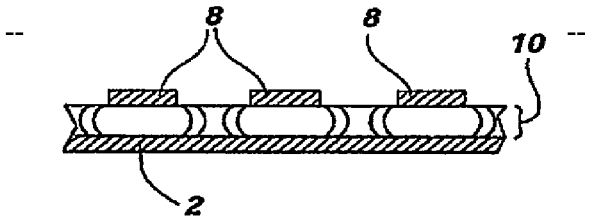

Fig. 2
(PRIOR ART)

Please replace FIG. 3 with the following replacement figure:

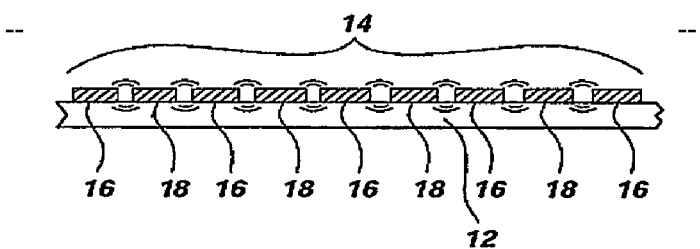

Fig. 3

UNITED STATES PATENT AND TRADEMARK OFFICE
CERTIFICATE OF CORRECTION

Figure 4:
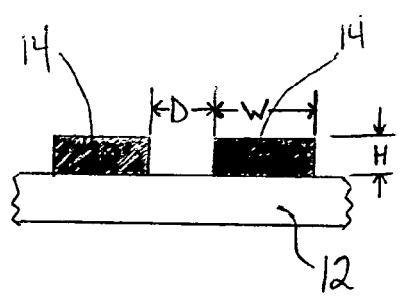
FIG. 4 is a diagram illustrating two adjacent circuit traces.

PATENT NO.        : 7,170,361 B1
APPLICATION NO.   : 09/548942
DATED             : January 30, 2007
INVENTOR(S)       : Farnworth It is certified that error appears in the above-identified patent and that said Letters Patent is hereby corrected as shown below:

In the drawings (cont'd):
Please replace FIG. 4 with the following replacement figure:

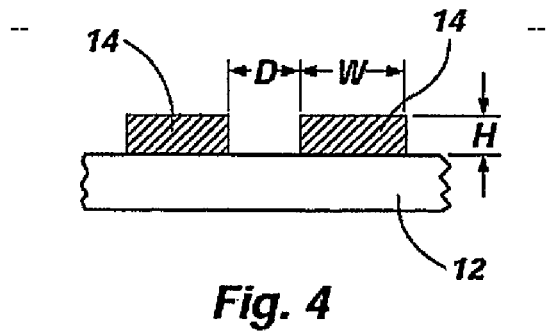
Fig. 4

Please replace FIG. 5 with the following replacement figure:

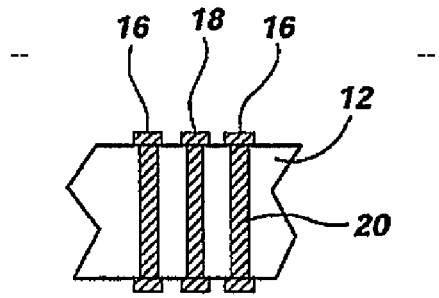
Fig. 5

Please replace FIG. 11 with the following replacement figure:

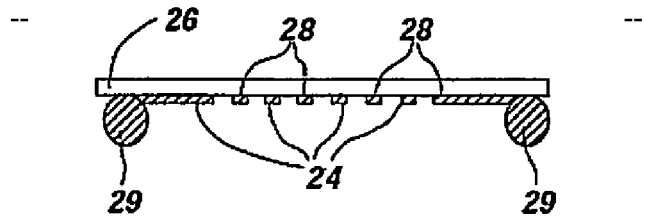
Fig. 11

UNITED STATES PATENT AND TRADEMARK OFFICE
CERTIFICATE OF CORRECTION

PATENT NO. : 7,170,361 B1  Page 4 of 7
APPLICATION NO. : 09/548942
DATED : January 30, 2007
INVENTOR(S) : Farnworth It is certified that error appears in the above-identified patent and that said Letters Patent is hereby corrected as shown below:

In the drawings (cont'd):
Please replace FIG. 12 with the following replacement figure:

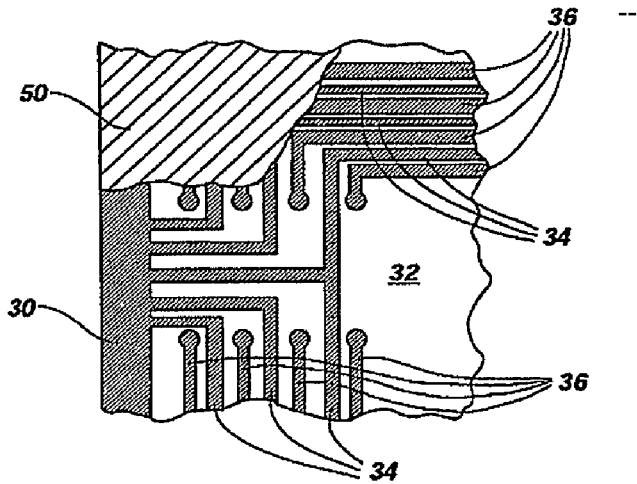

*Fig. 12*

Please replace FIG. 13 with the following replacement figure:

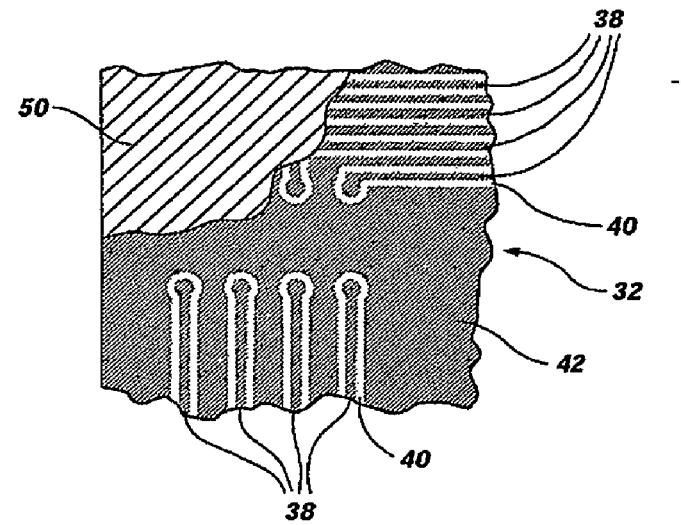

*Fig. 13*

UNITED STATES PATENT AND TRADEMARK OFFICE
CERTIFICATE OF CORRECTION

PATENT NO. : 7,170,361 B1
APPLICATION NO. : 09/548942
DATED : January 30, 2007
INVENTOR(S) : Farnworth It is certified that error appears in the above-identified patent and that said Letters Patent is hereby corrected as shown below:

In the drawings (cont'd):
Please replace FIG. 14 with the following replacement figure:

--  --

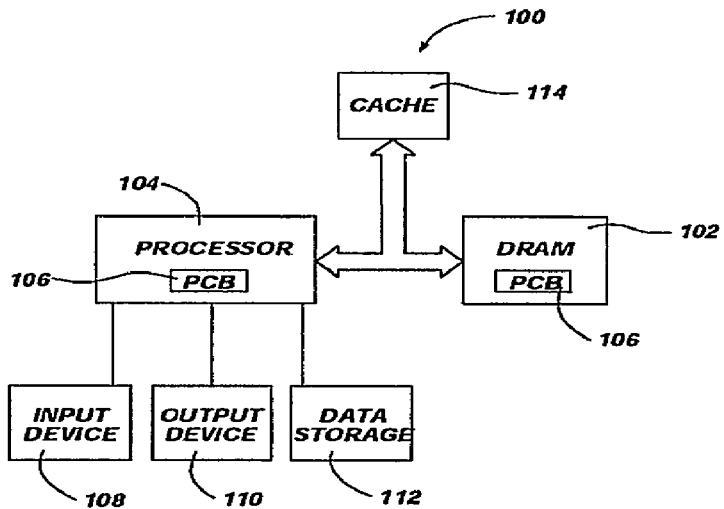

Fig. 14

Please replace FIG. 15 with the following replacement figure:

--  --

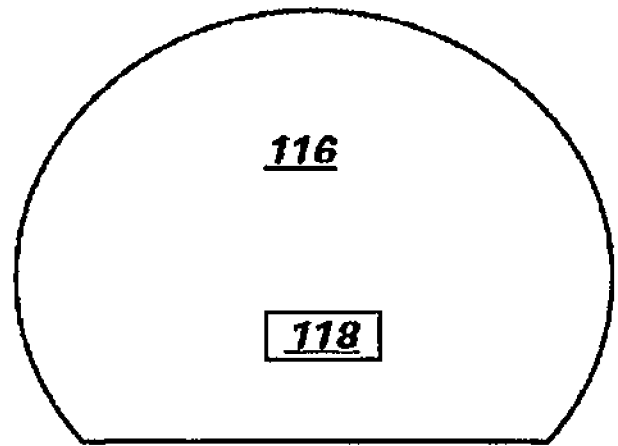

Fig. 15

UNITED STATES PATENT AND TRADEMARK OFFICE
CERTIFICATE OF CORRECTION

PATENT NO. : 7,170,361 B1
APPLICATION NO. : 09/548942
DATED : January 30, 2007
INVENTOR(S) : Farnworth It is certified that error appears in the above-identified patent and that said Letters Patent is hereby corrected as shown below:

In the claims:
CLAIM 2,   COLUMN 8,   LINE 29,   change "comprising;" to --comprising:--

Signed and Sealed this

Thirteenth Day of November, 2007

JON W. DUDAS
*Director of the United States Patent and Trademark Office*

United States Patent
Farnworth

(10) Patent No.: US 7,170,361 B1
(45) Date of Patent: Jan. 30, 2007

(54) METHOD AND APPARATUS OF INTERPOSING VOLTAGE REFERENCE TRACES BETWEEN SIGNAL TRACES IN SEMICONDUCTOR DEVICES

(75) Inventor: Warren M. Farnworth, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/548,942

(22) Filed: Apr. 13, 2000

(51) Int. Cl.
    H01P 3/08 (2006.01)

(52) U.S. Cl. .................. 333/1; 333/238; 333/247; 257/778; 257/780

(58) Field of Classification Search .......... 333/1, 333/238, 246, 247; 257/778, 780
    See application file for complete search history.

(56) References Cited

U.S. PATENT DOCUMENTS

| | | | |
|---|---|---|---|
| 3,398,232 A | * | 8/1968 | Hoffman .............. 333/1 X |
| 3,679,826 A | | 7/1972 | Crowell |
| 3,990,102 A | | 11/1976 | Okuhara et al. |
| 4,130,723 A | * | 12/1978 | Wakeling .............. 333/238 X |
| 4,349,848 A | | 9/1982 | Ishii et al. |
| 4,626,369 A | | 12/1986 | Yamamoto et al. |
| 4,651,163 A | | 3/1987 | Sutera et al. |
| 4,680,557 A | * | 7/1987 | Compton .............. 333/1 |
| 4,833,521 A | | 5/1989 | Early |
| 5,371,653 A | | 12/1994 | Kametani et al. |
| 5,451,917 A | | 9/1995 | Yamamoto et al. |
| 5,550,030 A | | 12/1996 | Kametani et al. |
| 5,631,446 A | * | 5/1997 | Quan .............. 174/254 |
| 5,675,298 A | | 10/1997 | Bhagwan et al. |
| 5,785,789 A | | 7/1998 | Gagnon et al. |
| 5,796,321 A | * | 8/1998 | Caillot et al. .............. 333/246 |
| 5,917,860 A | | 6/1999 | Lee |
| 5,945,886 A | * | 8/1999 | Millar .............. 333/1 |
| 5,952,709 A | | 9/1999 | Kitazawa et al. |
| 6,040,524 A | * | 3/2000 | Kobayashi et al. .......... 333/1 X |
| 6,175,287 B1 | * | 1/2001 | Lampen et al. .............. 333/247 |
| 6,181,278 B1 | * | 1/2001 | Kakimoto et al. ... 343/700 MS |
| 6,262,660 B1 | * | 7/2001 | Segale et al. .............. 257/728 |
| 6,373,740 B1 | * | 4/2002 | Forbes et al. .............. 333/238 X |

FOREIGN PATENT DOCUMENTS

DE  239899  * 10/1986  .............. 333/238

* cited by examiner

Primary Examiner—Benny Lee
(74) Attorney, Agent, or Firm—TraskBritt

(57) ABSTRACT

A method and apparatus for substantially reducing or eliminating electromagnetic and electrostatic coupling between signal traces on a substrate is disclosed. A substrate, such as a printed circuit board, is formed with an electrically insulative layer and a conductive layer. A portion of the conductive layer is removed to form circuit traces including signal traces and voltage reference traces configured such that each signal trace is separated from each other signal trace by at least one voltage reference trace. The invention is also applied to multiple layer printed circuit boards including a single voltage reference plane, an electronic system, and a semiconductor substrate. According to another aspect of the invention, a majority of a conductive layer is left on an insulative layer of a substrate by removing only those portions of the conductive layer immediately adjacent signal traces such that the remaining conductive material, which is ordinarily removed, acts to couple electromagnetic and electrostatic fields from the signal traces.

3 Claims, 4 Drawing Sheets